United States Patent [19]
Solomon

[11] Patent Number: 6,005,415
[45] Date of Patent: Dec. 21, 1999

[54] SWITCHING CIRCUIT FOR LARGE VOLTAGES

[75] Inventor: Paul Michael Solomon, Yorktown Heights, N.Y.

[73] Assignee: International Business Machines Corporation, Armonk, N.Y.

[21] Appl. No.: 08/896,924

[22] Filed: Jul. 18, 1997

[51] Int. Cl.⁶ .................... H03K 19/0175; H03K 19/094
[52] U.S. Cl. ............................... 326/83; 326/86; 326/80; 326/112
[58] Field of Search .................................. 326/83, 82, 86, 326/87, 80, 81, 112, 119, 120, 68

[56] References Cited

U.S. PATENT DOCUMENTS

| | | | |
|---|---|---|---|
| 4,042,839 | 8/1977 | Araki | 326/117 |
| 4,085,460 | 4/1978 | Lodi | 365/230 |
| 5,532,620 | 7/1996 | Seo et al. | 326/81 |

*Primary Examiner*—Michael Tokar
*Assistant Examiner*—Daniel D. Chang
*Attorney, Agent, or Firm*—Casey P. August; Anne Vachon Dougherty

[57] ABSTRACT

Method and apparatus for cascading devices wherein the output voltage is greater than the individual voltage capacity of the circuit components. The cascadable switch contains transistors connected so that the source and gate voltages on a given transistor are derived from the drain and source voltages of the preceding stage in the cascade. Depletion mode devices are utilized in one embodiment of the invention, while level shifter circuits are incorporated into another embodiment.

28 Claims, 4 Drawing Sheets

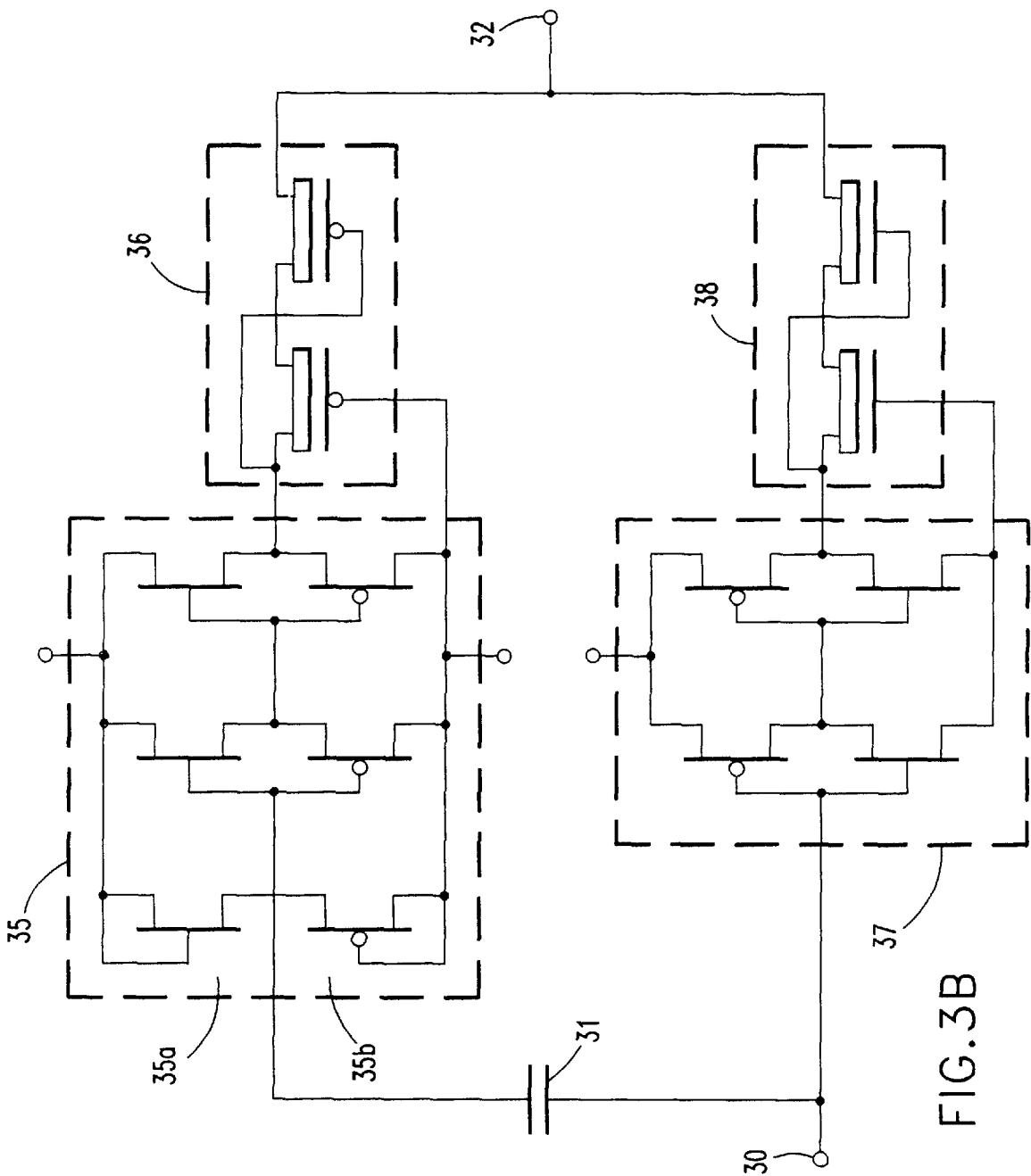
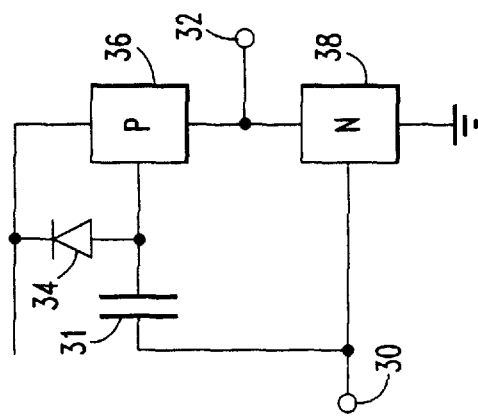
FIG.3B
FIG.3A

SWITCHING CIRCUIT FOR LARGE VOLTAGES

FIELD OF THE INVENTION

This invention relates to electronic circuitry and more particularly to semiconductor drive circuits for producing large output voltages.

BACKGROUND OF THE INVENTION

In electronic circuitry, an optimal drive circuit will provide voltage in excess of the breakdown voltages of the individual circuit components. For example, the cascode circuit, a cascaded transistor arrangement provides an output voltage which is up to two times (2×) the value of the breakdown voltages of each of the circuit's transistors. Such an output is particularly advantageous in an Electrically Erasable Programmable Read Only Memory (EEPROM) semiconductor circuit for performing a write operation, for example, by supplying a large voltage to the EEPROM in an efficient manner.

A simplified version of a cascode transistor circuit for providing a large output voltage can be seen in FIG. 1. In the FIG. 1 circuit, an input voltage of 5V from location 10 is provided to the gate of a first transistor 14. The gate of transistor 12 is connected to ground potential and the drain is connected to the source of the first transistor 14. For the sake of the example, resistor 16 is provided as a 10V load for the circuit, although in practice a p-channel device would generally be provided as the load. The output at node 18 will be from 0V to 10V, while each individual transistor, 12 and 14 each of which has a breakdown voltage of 5V, will see only 5V. Therefore, the cascade transistor arrangement is capable of providing a drive voltage of approximately 2× the breakdown voltage capability of the individual transistors.

The output voltage in semiconductor transistor circuits can be enhanced by increasing the breakdown voltages of the individual transistors, which can be accomplished by modifying the processing steps when fabricating the circuit components. For semiconductor transistors, using thicker gate oxide and tailoring the junction during ion implantation can improve the breakdown voltage of the individual transistors. A disadvantage to the known process modifications for enhancing the output voltage of drive circuits is that each process change is expensive in terms of monetary cost, time expenditure, and compromise to other aspects of circuit performance.

Implementation of cascade transistor circuits in silicon-on-insulator (SOI) substrates is desirable due to the dielectric isolation between devices. However, optimal performance of SOI cascade transistor structures is not realized because the breakdown voltages are reduced by the floating body effect encountered in SOI.

While transistors are detailed herein, it will be clear to one having skill in the relevant art that the foregoing, and ensuing, descriptions can be applied to any three terminal amplifier, wherein a certain input voltage is applied to one terminal and the output current is controlled at the two output terminals, such that the device has a breakdown voltage which cannot be exceeded. While the three terminal amplifiers most commonly used today are transistors, the invention can be applied to other three terminal amplifiers, such as vacuum tubes.

It is therefore desirable, and is an objective of the present invention, to devise an improved drive circuit which will provide enhanced operating voltage.

It is another objective of the present invention to produce an improved semiconductor drive circuit having enhanced output voltage without increasing the cost of semiconductor processing.

It is yet another objective of the present invention to provide an improved semiconductor drive circuit which can readily be implemented under existing silicon-on-insulator (SOI) C-MOS technology.

SUMMARY OF THE INVENTION

These and other objectives are realized by the inventive method and apparatus for cascading devices wherein the output voltage is greater than the individual voltage capacity of the circuit components. The cascadable switch contains transistors connected so that the source and gate voltages on a given transistor is derived from the drain and source voltages of the preceding stage in the cascade. Depletion mode devices are utilized in one embodiment of the invention, while level shifter circuits are incorporated into another embodiment. The best mode is implemented using SOI C-MOS technology, yet the invention can be applied not only to SOI C-MOS, but also to bulk C-MOS, to other integrated circuit technologies such as gallium arsenide, to discrete transistors, and even to vacuum tubes, for generation of extremely high voltages.

BRIEF DESCRIPTION OF THE DRAWINGS

The invention will now be described in detail with specific reference to the Figures wherein:

FIGS. 3A and 3B provide illustrations of two embodiments of EEPROM drivers using the circuit inventive arrangement in complementary configuration.

DESCRIPTION OF THE PREFERRED EMBODIMENT

Figure 1:
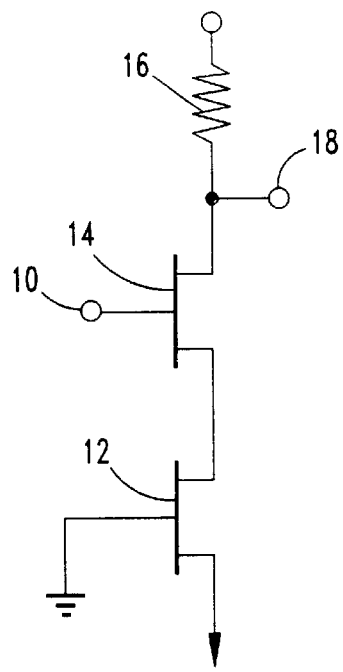
FIG. 1 illustrates a simplified cascode circuit in accordance with the prior art.
Figure 2:
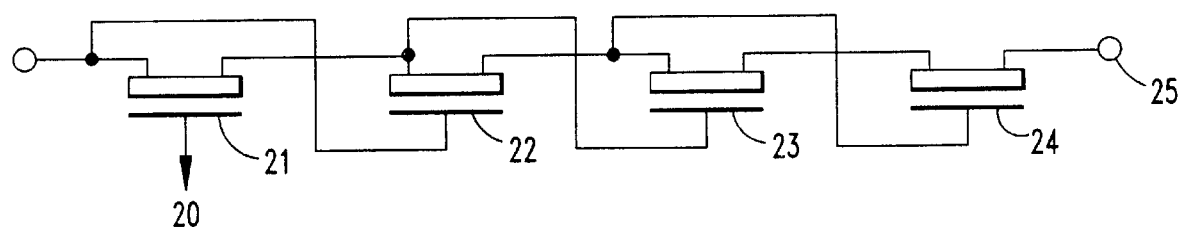
FIG. 2 shows the cascade arrangement of the present invention.

As depicted in FIG. 2, the inventive cascade circuit includes a plurality of transistors, 21–24, connected in such a way that the first transistor in the chain, 21, has its gate tied to the potential of the voltage source, 20, while each succeeding transistor, 22–24, has derives its reference potential from the source of the previous transistor, without reference to any outside potential. As illustrated, the succeeding transistors are connected in such a way that the source and gate of the succeeding transistor are derived from the drain and source of the preceding stage, respectively. The inventive circuit arrangement effectively allows indefinite cascading of transistors, forming a chain of arbitrary length in accordance with the requirements of the end product.

The maximum voltage gain supplied by the transistor chain is limited to less than the voltage gain of a single transistor. Another limitation is the ratio of the capacitance of the transistor's active channel region to ground as compared to the gate-to-channel capacitance. The presence of this capacitance increases the threshold voltage of transistors operating above ground potential, thus limiting the maximum voltage that can be achieved. As noted above, the best mode is implemented in an SOI structure which provides complete dielectric isolation, thereby limiting the capacitance effects. With high voltages across the chain of transistors in the "off" condition, the circuit exhibits high resistance, with the source to drain junction of respective transistors conducting current to distribute the voltage across the chain of transistors without catastrophic breakdown. In the "on" condition, the chain of transistors drives the output to the value of its respective input with very little voltage drop across the circuit. Assuming a breakdown voltage of 2V on each of transistors 21–24, an output voltage of approximately up to 8V at node 25 can be realized from the circuit as shown.

The detailed operation of the circuit is as follows: the transistors in the chain are either "on" (having low source-drain voltage), "active" (having variable source-drain voltage), or "off" (wherein the source-drain voltage equals the breakdown voltage). Only one transistor in the chain will be "active," with the current determined by the gate-source and gate-drain voltage, and wherein any transistors above or ahead (i.e., further from the voltage supply) of the active transistor will be "off," with the current being carried by breakdown, while any transistors below or before it will be "on." The position of the active transistor will be:

$$N - \text{Int}(V_{out}/V_{br})$$

where N is the number of transistors in the chain, $V_{out}$ is the output voltage, $V_{br}$ is the breakdown voltage, and Int is the function specifying rounding down. For example, at a specified input voltage, which determined the current through the chain, at a low output voltage, the last transistor, 24 in FIG. 2, would be active and all of the other transistors would be on. As the output voltage would be increased beyond the breakdown, the last transistor, 24, turns off and the second from the last transistor, 23 in FIG. 2, becomes active, and so on until, at the maximum output voltage, the first transistor, 21, is active and all of the rest in the chain are off.

FIG. 3A illustrates a basic complementary driver circuit wherein voltage provided at input 30 is switched through either the inventive circuit 36, implemented as a p-channel device, or inventive circuit 38, which is implemented as an n-channel device, to provide output at 32. In the FIG. 3B embodiment, the inventive circuit is provided in an EEPROM driver, with depletion mode devices connected in accordance with the present invention in circuit stages 36 and 38, each provided in series with EEPROM circuit stages 35 and 37, respectively, between input 30 and output 32. The FIG. 3 embodiment illustrates depletion mode transistor devices in each of the circuit stages 36 and 38. As noted above, the number of cascaded transistors connected in accordance with the present teachings may be arbitrarily large depending upon the output voltage need of the circuit.

The high voltage driver illustrated in FIG. 3 consists of p-channel, 36, and n-channel, 38, embodiments of the present invention, driven by two stages of standard C-MOS invertor circuits, 35 and 37. The input to cascade 35 is clamped by input clamps, 35a and 35b, and is capacitively coupled to the input of the driver, 30, via capacitor 31. The top clamp, 35a, is made more conductive than the bottom clamp, 35b, so that the p-channel cascade, 36, is switched off under quiescent conditions. The inverters, 35 and 37, are operated from high voltage power supplies, which can be generated on-chip by using charge pumps (not shown) if necessary. Because the upper inverter chain, 35, is AC coupled to the input, some refresh circuitry (not shown) is necessary if very long output pulses, of for example many milliseconds, are desired.

Under quiescent conditions, the input, 30, is low, the n-channel cascade, 38, is on, and the p-channel cascade, 36, is off, causing the output 32 to be low. When a positive pulse of standard logic voltage (e.g., 1.5V) is applied to the input, 30, the pulse is level-shifted via the capacitor, 31, and the clamps, 35a and 35b, and is buffered by the invertor chains, 35 and 37, to switch the p-channel cascade, 36, on and to switch off the n-channel cascade, 38, thereby generating a positive, high voltage pulse at the output, 32 (8V for this example).

Figure 4:
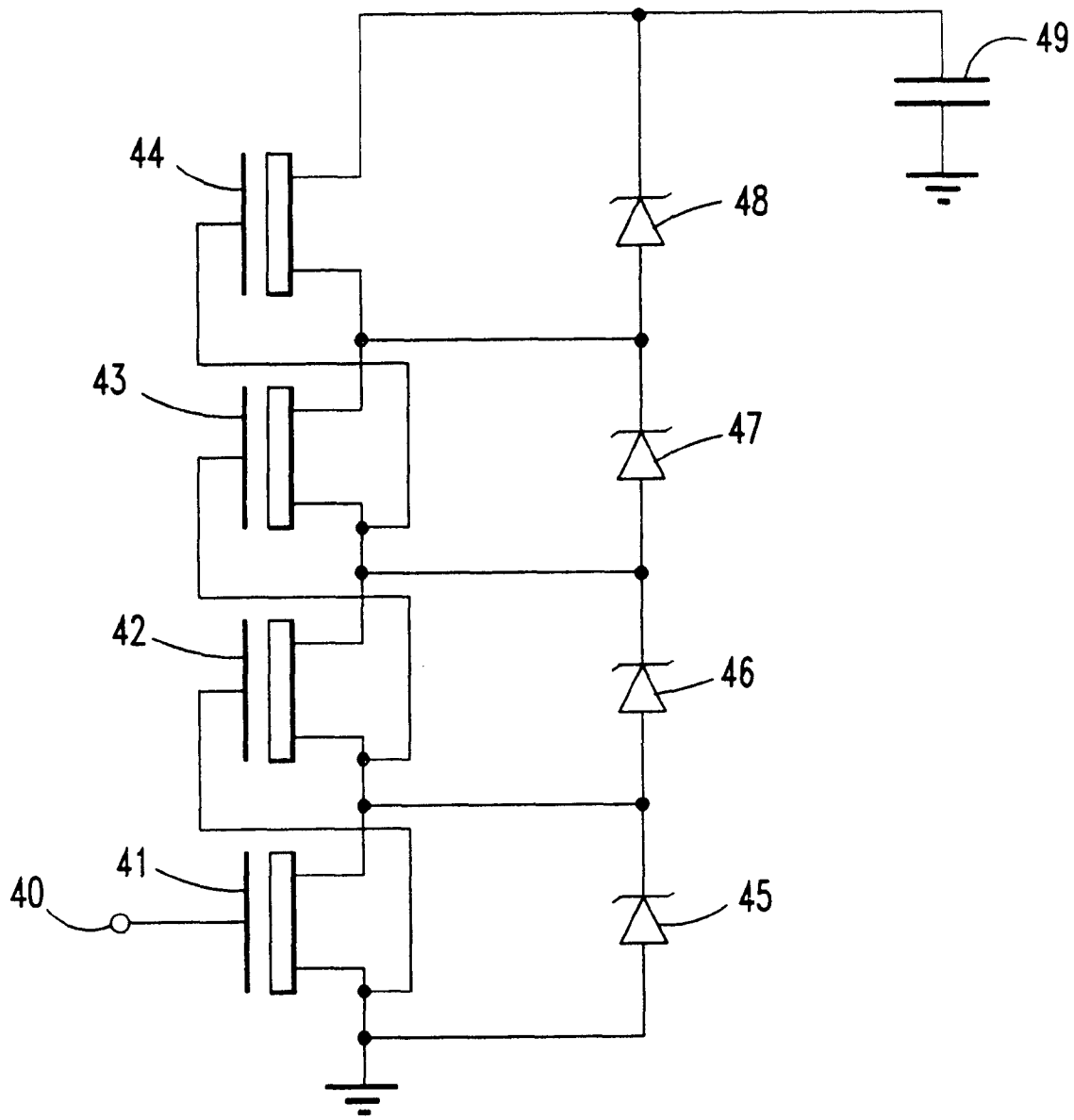
FIG. 4 depicts a second embodiment of the present invention wherein diodes are incorporated into the EEPROM driver circuit to provide controlled breakdown.

The embodiments in FIG. 2 and 3 assume reliance on the breakdown voltage of the transistors themselves, which may not be realistic for some applications. Therefore, the circuit illustrated in FIG. 4, having field effect transistors 41–44, connected in accordance with the present teachings, between input 40 and output 49, provides zener diodes, 45–48, interposed between the source and the drain of each respective device to control the breakdown voltages. The diodes shunt the voltage to a single transistor, which is able to handle the reduced voltage. For example, if the input transistor 41 is switched on, the breakdown current is carried through diodes 45–48 to that transistor, 41, at which a reduced voltage is seen. For the sake of example, given a breakdown voltage of 2V for the zener diodes, the maximum voltage to be allowed at the output is 8V, and each transistor will have a maximum drain-to-source voltage of 2V and a maximum drain-to-gate voltage of 4V.

Figure 5:
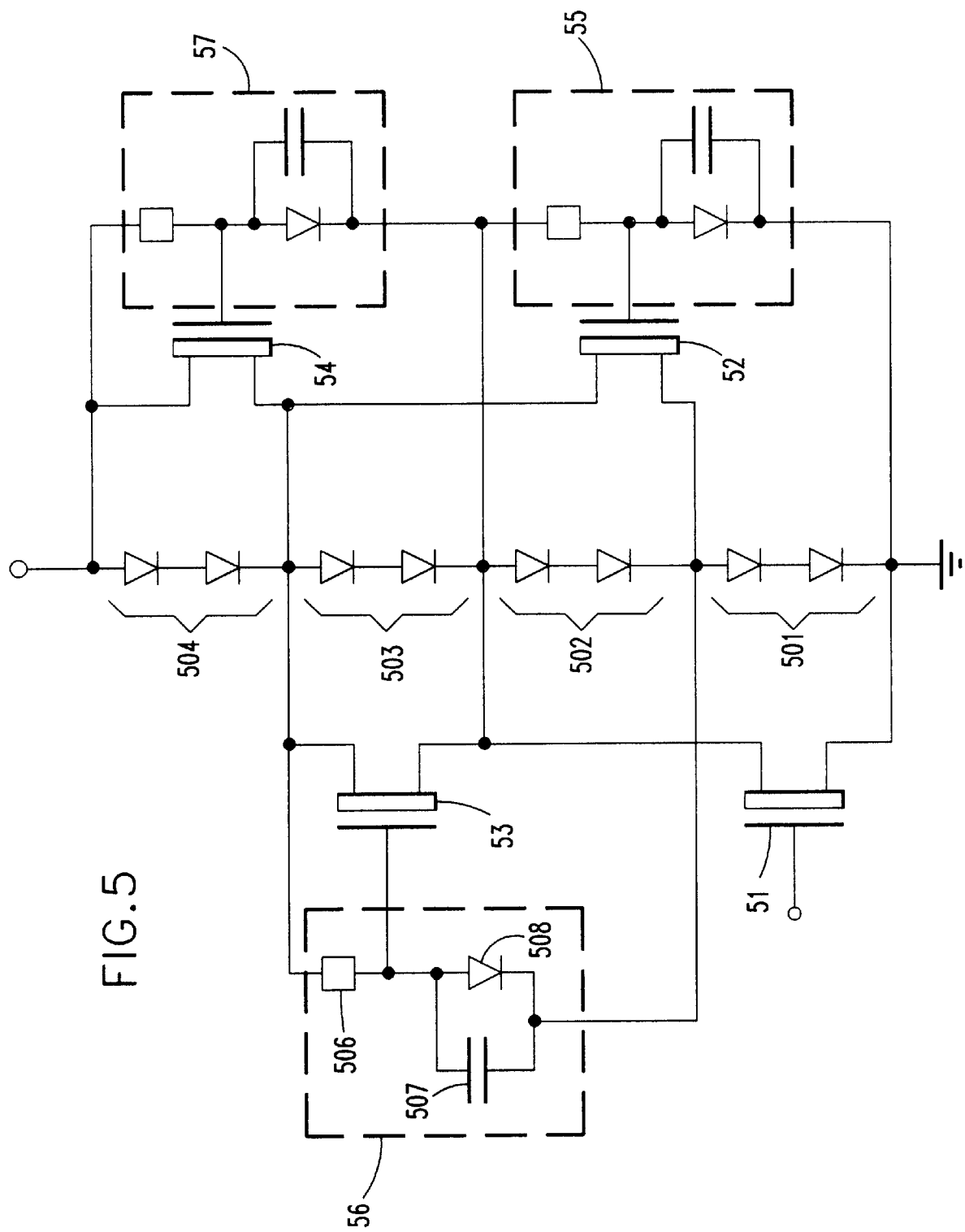
FIG. 5 provides an illustration of a standard SOI C-MOS embodiment of the present invention.

While the invention as illustrated above can be implemented in a C-MOS environment, one generally does not incorporate depletion mode devices in C-MOS circuits. Therefore, an alternative embodiment is illustrated in FIG. 5. The input voltage from node 50 is provided to a first transistor 51, which has diode pair 501 connected between its source and drain in order to control the breakdown, as discussed above. Each succeeding transistor, 52–54, similarly has a diode pair, 502–504 connected between its source and drain. The gate of each of the succeeding transistors, 52–54, is connected to the source of the preceding transistor, as had been shown with respect to the depletion mode devices, above. Since the devices are not depletion mode, however, a level shifter circuit is interposed between the gate of the preceding stage and the source of each transistor, 52–54. The level shifter circuits, 55–57, are each representatively comprised of a current bleeder, a diode and a capacitor. As shown for level shifter circuit 56, the current bleeder 505, which may be comprised of two back-to-back zero threshold devices to provide for bidirectional operation, is connected in series with the parallel circuit of a diode 506 and a capacitor 507. The current bleeder provides a small current to bias the diode and charge the capacitor, thereby simulating a depletion mode state.

The invention has been described with reference to several specific embodiments. One having skill in the relevant art will recognize that modifications may be made without departing from the spirit and scope of the invention as set forth in the appended claims.

Having thus described invention, what I claim as new and desire to secure by Letters Patent is:

1. A multiple transistor circuit comprising a plurality of transistors for driving circuit output to a first voltage when on and for withstanding voltages greater than the breakdown voltages of the transistors when off, comprising:

a first transistor and at least one successive transistor, each having a source, drain and gate; and an input node for receiving an input signal, said input node being coupled to the gate of said first transistor; and an output node;

wherein said transistors are connected so that the voltage at each of the source and gate on each of said at least one successive transistor are respectively derived from the drain and source of the preceding transistor and wherein the drain of the last of said one successive transistor is connected to said output node.

2. The circuit of claim 1 wherein said at least one successive transistor is a depletion mode device.

3. The circuit of claim 1 wherein said first and said at least one successive transistors exhibit controlled breakdown.

4. The circuit of claim 1 further comprising a plurality of circuit means to control the breakdown voltage of each associated transistor.

5. The circuit of claim 4 wherein said plurality of circuit means comprises a plurality of zener diodes.

6. The circuit of claim 4 wherein each of said plurality of circuit means comprises at least one forward biased diode interposed between the source and the drain of each of said transistors.

7. The circuit of claim 1 wherein said circuit is provided as a C-MOS circuit.

8. The circuit of claim 7 wherein said at least one successive transistor is a depletion mode device.

9. The circuit of claim 7 wherein said first and said at least one successive transistors exhibit controlled breakdown.

10. The circuit of claim 7 further comprising a plurality of circuit means to control the breakdown voltage of each associated transistor.

11. The circuit of claim 10 wherein said plurality of circuit means comprises a plurality of zener diodes.

12. The circuit of claim 10 wherein each of said plurality of circuit means comprises at least one forward biased diode interposed between the source and the drain of each of said transistors.

13. The circuit of claim 1 further comprising a plurality of level shifter circuits associated with each of said at least one successive transistors, each level shifter being connected between the gate of each of said at least one successive transistor and the source of the preceding transistor.

14. The circuit of claim 13 wherein each level shifter comprises a current bleeder circuit connected in series with the parallel circuit of a diode and a capacitor.

15. The circuit of claim 14 wherein said current bleeder comprises two zero threshold devices.

16. The circuit of claim 13 wherein said first and said at least one successive transistors exhibit controlled breakdown.

17. The circuit of claim 13 further comprising a plurality of circuit means to control the breakdown voltage of each associated transistor.

18. The circuit of claim 17 wherein said plurality of circuit means comprises a plurality of zener diodes.

19. The circuit of claim 17 wherein each of said plurality of circuit means comprises at least one forward biased diode interposed between the source and the drain of each of said transistors.

20. The circuit of claim 7 further comprising a plurality of level shifter circuits associated with each of said at least one successive transistors, each level shifter being connected between the gate of each of said at least one successive transistor and the source of the preceding transistor.

21. The circuit of claim 20 wherein each level shifter comprises a current bleeder circuit connected in series with the parallel circuit of a diode and a capacitor.

22. The circuit of claim 21 wherein said current bleeder comprises two zero threshold devices.

23. The circuit of claim 20 wherein said first and said at least one successive transistors exhibit controlled breakdown.

24. The circuit of claim 20 further comprising a plurality of circuit means to control the breakdown voltage of each associated transistor.

25. The circuit of claim 24 wherein said plurality of circuit means comprises a plurality of zener diodes.

26. The circuit of claim 24 wherein each of said plurality of circuit means comprises at least one forward biased diode interposed between the source and the drain of each of said transistors.

27. An electrically erasable programmable read only memory driver comprising:

a source voltage input node;

a voltage output node;

first and second cascade circuits connected in parallel between said input and said output nodes, said first and second cascade circuits each comprising a first transistor and at least one successive transistor, each having a source, drain and gate, wherein said transistors are connected so that the source and gate voltages on each of said at least one successive transistor are derived from the drain and source voltages of the preceding transistor, and wherein said first and said second cascade circuits are complementary.

28. The driver of claim 27 wherein said first cascade circuit comprises a p-channel circuit and wherein said second cascade circuit comprises an n-channel circuit.

* * * * *